(12) United States Patent
Bao et al.

(10) Patent No.: US 12,489,008 B2
(45) Date of Patent: Dec. 2, 2025

(54) BLACK WHEELS FOR TRANSPORTING ULTRA-THIN SILICON WAFER

(71) Applicant: TCL ZHONGHUAN RENEWABLE ENERGY TECHNOLOGY CO., LTD., Tianjin (CN)

(72) Inventors: Muren Bao, Tianjin (CN); Feiyang Li, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 0 days.

(21) Appl. No.: 18/548,084

(22) PCT Filed: Jul. 31, 2023

(86) PCT No.: PCT/CN2023/110387
§ 371 (c)(1),
(2) Date: Aug. 26, 2023

(87) PCT Pub. No.: WO2024/041324
PCT Pub. Date: Feb. 29, 2024

(65) Prior Publication Data
US 2025/0038026 A1    Jan. 30, 2025

(30) Foreign Application Priority Data
Aug. 25, 2022    (CN) .......................... 202222251649.3

(51) Int. Cl.
*B65H 3/48*    (2006.01)
*B28D 5/00*    (2006.01)
(Continued)

(52) U.S. Cl.
CPC ...... *H01L 21/67718* (2013.01); *B28D 5/0082* (2013.01); *B65G 49/068* (2013.01);
(Continued)

(58) Field of Classification Search
CPC .......... B65H 29/54; B65H 29/56; B65H 3/48; B65H 5/22; B65H 5/228;
(Continued)

(56) References Cited

U.S. PATENT DOCUMENTS

| | | | | |
|---|---|---|---|---|
| 5,913,345 | A * | 6/1999 | Corrado | G03D 15/00 15/3 |
| 2008/0146003 | A1* | 6/2008 | Wang | B28D 5/0082 438/464 |
| 2012/0006726 | A1* | 1/2012 | Kusuhara | B65G 59/02 414/801 |
| 2012/0076633 | A1* | 3/2012 | Renn | B28D 5/0082 414/801 |

(Continued)

FOREIGN PATENT DOCUMENTS

| | | | |
|---|---|---|---|
| CN | 101652849 | A | 2/2010 |
| CN | 106163752 | A | 11/2016 |

(Continued)

OTHER PUBLICATIONS

International Search Report in International application No. PCT/CN2023/110387, mailed on Oct. 16, 2023.
(Continued)

*Primary Examiner* — Luis A Gonzalez
(74) *Attorney, Agent, or Firm* — PV IP PC; Christopher S. Ruprecht; Wei Te Chung

(57) ABSTRACT

A black wheel for transporting an ultra-thin silicon wafer may include grooves provided on a side surface of the black wheel along a circumferential direction of the black wheel. Compressed air lines are respectively accommodated within the grooves, and an air outlet of each of the compressed air lines is provided to align with a side of the ultra-thin silicon wafer close to a next process device.

20 Claims, 4 Drawing Sheets

(51) Int. Cl.
  *B65G 49/06* (2006.01)
  *B65H 5/22* (2006.01)
  *B65H 29/54* (2006.01)
  *B65H 29/56* (2006.01)
  *H01L 21/677* (2006.01)

(52) U.S. Cl.
  CPC ............... *B65H 3/48* (2013.01); *B65H 5/22* (2013.01); *B65H 29/54* (2013.01); *B65H 29/56* (2013.01); *H01L 21/67706* (2013.01); *B65H 2404/13161* (2013.01); *B65H 2406/12* (2013.01)

(58) Field of Classification Search
  CPC ...... B65H 2404/13161; B65H 2406/12; B65H 2406/122; B65G 49/068; B65G 49/061; B28D 5/0082; B28D 5/0094; H01L 21/67706; H01L 21/67718
  See application file for complete search history.

(56) References Cited

U.S. PATENT DOCUMENTS

2017/0012009 A1* 1/2017 Olson .................... H01L 24/03

FOREIGN PATENT DOCUMENTS

| CN | 113734800 A | 12/2021 | |
|---|---|---|---|
| CN | 217134337 U | 8/2022 | |
| CN | 218182182 U | 12/2022 | |
| WO | WO-2015155729 A1 * | 10/2015 | ....... H01L 21/67092 |

OTHER PUBLICATIONS

Written Opinion of the International Search Authority in International application No. PCT/CN2023/110387, mailed on Oct. 16, 2023.

* cited by examiner

BLACK WHEELS FOR TRANSPORTING ULTRA-THIN SILICON WAFER

CROSS REFERENCE TO RELATED APPLICATIONS

This application claims the benefit of priority to Chinese Patent Application No. 202222251649.3 filed on Aug. 25, 2022, the content of which is incorporated herein by reference in its entirety.

TECHNICAL FIELD

The present disclosure relates to silicon wafer processing, and particularly relates to black wheels for transporting ultra-thin silicon wafers.

BACKGROUND

A silicon rod is cut to form silicon wafers (or referred to be silicon sheets), and the silicon wafers are degummed, inserted, cleaned, and inspected, to generate qualified silicon wafers. As shown in FIG. 1, the silicon wafers 4 are converted from a vertical state to a horizontal state by being absorbed by a black wheel 1 one by one from a bottom surface of a water tank 5, and transported to a horizontal conveyor belt 6 at a next process, and then the wafers are inserted. The ultra-thin silicon wafer is thinner, and a bending degree thereof is greater. In addition, the black wheel has strong absorbability. Therefore, during a transmission process of the silicon wafer, the silicon wafer is closely attached to a surface of the black wheel. When the silicon wafer is transported towards the horizontal conveyor belt, a side of the silicon wafer close to the horizontal conveyor belt may not be lifted, so that the silicon wafer cannot be transported onto the lower conveyor belt, and cannot be inserted at the next process. At the same time, due to the excessive bending of the silicon wafer, the silicon wafer may be easily damaged.

SUMMARY

In view of the above, in an aspect, a black wheel for transporting an ultra-thin silicon wafer includes grooves on a side surface of the black wheel along a circumferential direction of the black wheel, wherein compressed air lines are respectively accommodated within the grooves, and an air outlet of each of the compressed air lines is provided to align with a side of the ultra-thin silicon wafer close to a next process.

In some embodiments of the present disclosure, the grooves are arranged parallel to an end surface of the black wheel.

In some embodiments of the present disclosure, the grooves are uniformly distributed on a side surface of the black wheel along an axial direction of the black wheel.

In some embodiments of the present disclosure, respective bottom surfaces of the grooves are at a same distance from a side surface of the black wheel, and the compressed air lines are provided at a same height from the side surface of black wheel.

In some embodiments of the present disclosure, the compressed air lines are in clearance fit with the grooves respectively.

In some embodiments of the present disclosure, each of the grooves has a depth larger than a diameter of each of the compressed air lines.

In some embodiments of the present disclosure, the black wheel is rotatable and the compressed air lines respectively within the grooves are fixed.

In some embodiments of the present disclosure, both side faces of each of the grooves are disposed vertically.

In some embodiments of the present disclosure, both side faces of each of the grooves are disposed symmetrically inclined with respect to a vertical direction.

In another aspect, a black wheel for transporting an ultra-thin silicon wafer, wherein the black wheel is configured to convert the ultra-thin silicon wafer from a vertical state to a horizontal state, and transport the ultra-thin silicon wafer onto a horizontal conveyor belt at a next process, and wherein the black wheel includes grooves on a side surface of the black wheel along a circumferential direction of the black wheel, and compressed air lines are respectively accommodated within the grooves and are configured to blow up a side of the ultra-thin silicon wafer close to the horizontal conveyor belt when the silicon wafer approaches the horizontal conveyor belt, so that the ultra-thin silicon wafer is transported onto the horizontal conveyor belt.

LIST OF REFERENCE SIGNS

Figure 1:
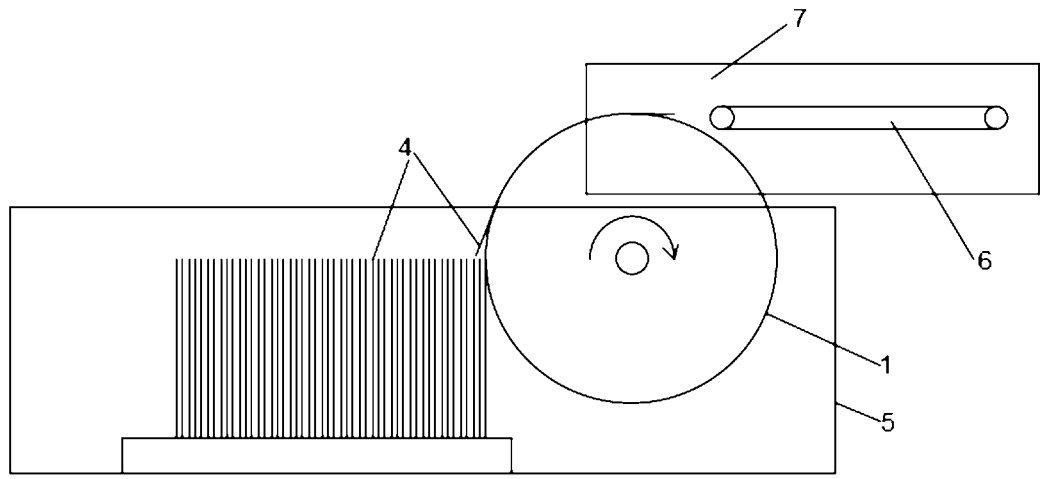
FIG. 1 is a schematic view of use of a black wheel in the related art.

| 1: Black wheel; | 2: Groove; | 3: Compressed air line; |
| --- | --- | --- |
| 3.1: Air outlet; | 4: Silicon wafer; | 5: Liquid tank; |
| 6: Horizontal conveyor belt; | 7: Guard plate; | 41: End surface; |
| 42 Side surface. | | |

DETAILED DESCRIPTION

An embodiment of the present disclosure provides a black wheel which may be configured to transport ultra-thin silicon wafers, and an embodiment of the present disclosure is described below with reference to accompanying drawings.

As shown in FIGS. 2 to 7, a black wheel for transporting ultra-thin silicon wafers according to an embodiment of the present disclosure is configured to absorb silicon wafers 4 in a vertical state one by one from a bottom surface of a liquid tank 5, convert the silicon wafers 4 from the vertical state to a horizontal state, and transport the silicon wafers 4 to a horizontal conveyor belt 6 at a next process, so that the silicon wafers 4 are spaced apart from each other, to be subjected to an inserting process. The liquid tank 5 may include water tank. Due to a stronger adsorption force from the black wheel 1, the ultra-thin silicon wafer 4 is adsorbed onto a side surface 42 of the black wheel 1, and cannot be lifted when approaching the horizontal conveyor belt 6, and then cannot be transported onto the horizontal conveyor belt 6. Grooves 2 are formed on the side surface 42 of the black wheel 1 along a circumferential direction of the black wheel 1. The number of the grooves 2 is not limited herein. Compressed air lines 3 are respectively accommodated within the grooves 2, and are configured to blow up a side of the ultra-thin silicon wafer 4 close to the horizontal conveyor belt 6 when the silicon wafer 4 approaches the horizontal conveyor belt 6, so that the ultra-thin silicon wafer 4 is smoothly transported onto the horizontal conveyor belt 6 for the next process.

Figure 2:
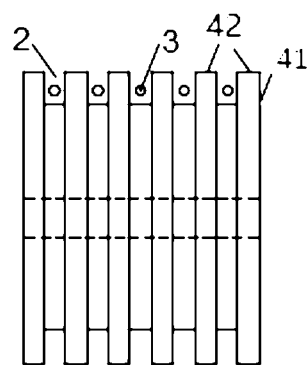
FIG. 2 is a front view of a black wheel for transporting ultra-thin silicon wafers according to an embodiment of the present disclosure.
Figure 4:
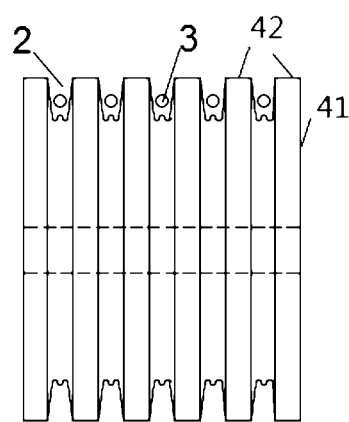
FIG. 4 is a front view of a black wheel for transporting ultra-thin silicon wafers according to an embodiment of the present disclosure.

In an embodiment of the present disclosure, as shown in FIGS. 2 and 4, the grooves 2 are arranged parallel to an end surface 41 of the black wheel 1. In order to enable compressed air from the compressed air lines 3 is blown directly towards the silicon wafer 4 and to save an amount of the compressed air, the grooves 2 are arranged along the circumferential direction of the black wheel and parallel to the end surface 41 of the black wheel 1. Both side faces of each of the grooves 2 may be disposed vertically or symmetrically inclined with respect to a vertical direction.

In an embodiment of the present disclosure, the grooves 2 are uniformly distributed on the side surface 42 of the black wheel 1 along an axial direction of the black wheel 1, to obtain same surface adsorption forces from different portions of the black wheel 1.

In an embodiment of the present disclosure, in order to make the compressed air lines installed at a same height in the grooves 2, bottom surfaces of the grooves 2 are at a same distance from the side surface 42 of the black wheel 1. In a sectional view, the bottom surface of each of the grooves 2 may have a straight line shape in a horizontal direction or a curve shape. When the bottom surfaces of the grooves 2 have the straight line shape in the horizontal direction in the sectional view, the straight lines have a same height from the side surface 42 of the black wheel 1. In a sectional view, when the bottom surfaces of the grooves 2 have the curve shape, the curves have a same shape, and the curves are at a same distance from the side surface 42 of the black wheel 1.

In an embodiment of the present disclosure, the compressed air lines 3 are fixed onto guard plates 7 on both sides of the horizontal conveyor belt 6, and the black wheel 1 is rotated. Therefore, the compressed air lines 3 are in clearance fit with the grooves 2 on the black wheel 1. The manner for fixing the compressed air lines 3 is not limited herein, as long as the rotation of the black wheel 1 and the transport of the silicon wafer 4 are not interfered. For example, the compressed air line 3 may be supported by a bracket and fixed with a clamp, and the bracket may be fixed to the guard plates 7 on the both sides of the horizontal conveyor belt 6. In order to uniformly distribute the air flow, the compressed air lines 3 are disposed at middles of the grooves 2. In an embodiment of the present disclosure, the compressed air lines 3 may be provided at a same height from the side surface 42 of black wheel. The compressed air line 3 includes PE or stainless steel, and a material of the compressed air line 3 is not limited herein.

Figure 3:
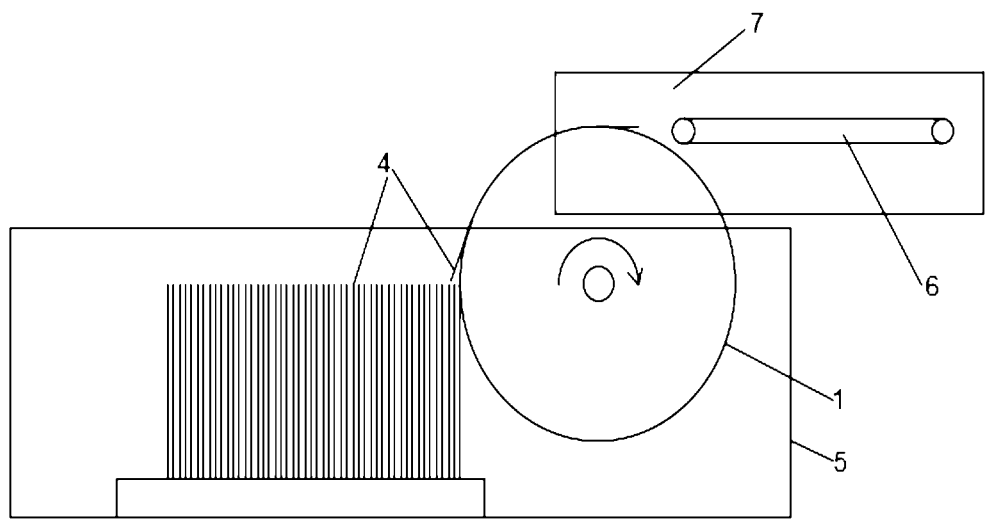
FIG. 3 is a side view of a black wheel for transporting ultra-thin silicon wafers according to an embodiment of the present disclosure.
Figure 5:
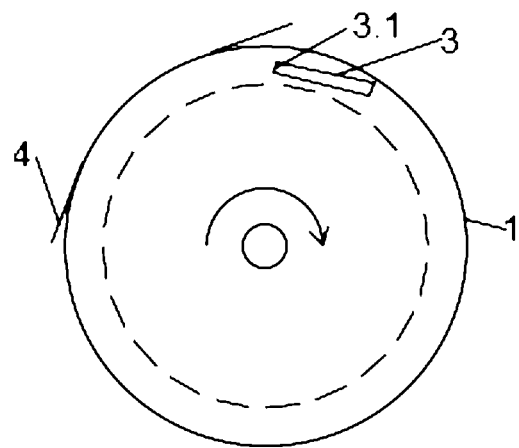
FIG. 5 is a side view of a black wheel for transporting ultra-thin silicon wafers according to an embodiment of the present disclosure.
Figure 6:
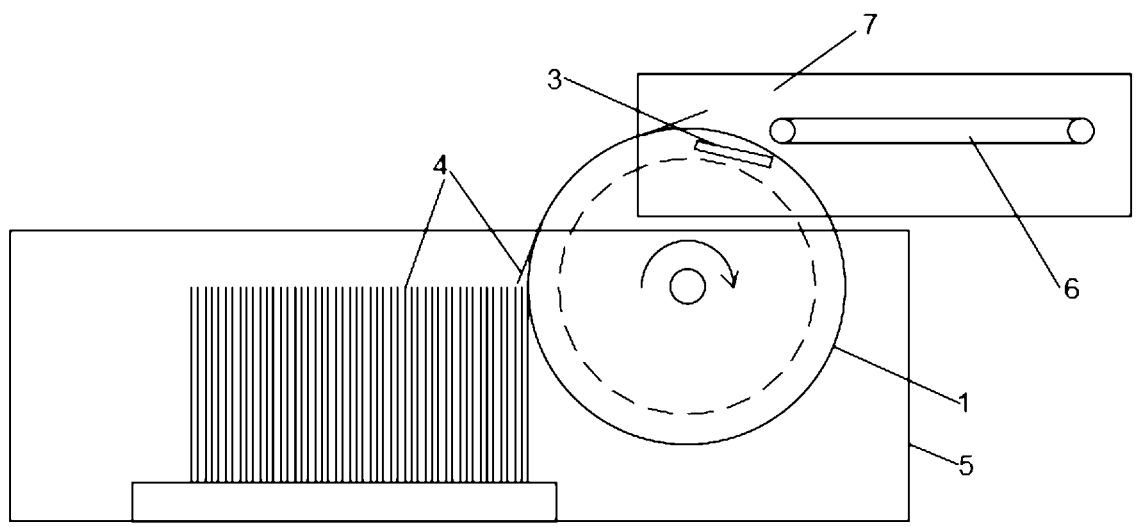
FIG. 6 is a schematic view of use of a black wheel for transporting ultra-thin silicon wafers according to an embodiment of the present disclosure.
Figure 7:
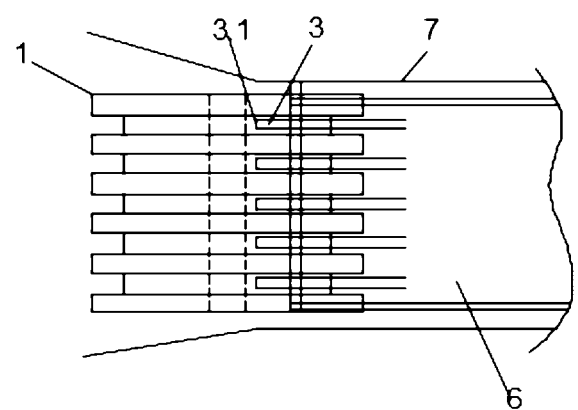
FIG. 7 is a top view of a black wheel in use for transporting ultra-thin silicon wafers according to an embodiment of the present disclosure.

In an embodiment of the present disclosure, as shown in FIGS. 3 and 5, in order to save the compressed air while facilitating the warping of a side of the silicon wafer 4 close to the horizontal conveyor belt 6, an air outlet 3.1 of each of the compressed air lines 3 is provided to align with or face the side of the silicon wafer 4 close to the horizontal conveyor belt 6. The compressed air lines 3 may be bent, arranged horizontally, or arranged obliquely with respect to a horizontal direction, so long as the rotation of the black wheel 1 and the transport of the silicon wafer 4 are not interfered.

In an embodiment of the present disclosure, in order that the compressed air lines 3 does not interfere with the transport of the silicon wafer 4, each of the grooves 2 has a depth larger than a diameter of each of the compressed air lines 3, so that the compressed air lines 3 may be received within the groove 2.

Embodiment 1: as shown in FIGS. 2 and 3, a black wheel for transporting ultra-thin silicon wafers is provided. Grooves 2 are formed parallel to an end surface 41 of the black wheel 1 in a circumferential direction of the black wheel 1. The grooves 2 are uniformly distributed along an axial direction of the black wheel 1. Both side faces of each of the grooves 2 are vertically arranged. In a sectional view, a bottom surface of each of the grooves 2 has a straight line shape in a horizontal direction, and the bottom surfaces of the grooves 2 are at a same distance from a side surface 42 of the black wheel 1. The compressed air lines 3 are in clearance fit with the grooves 2 and are provided in middles of the grooves 2. Each of the compressed air lines 3 is horizontally disposed, with an air outlet 3.1 aligned with or face a side of the silicon wafer 4 close to the horizontal conveyor belt 6. Each of the grooves 2 has a depth larger than a diameter of each of the compressed air lines 3. In the present embodiment, the compressed air lines 3 include PE.

Embodiment 2: As shown in FIGS. 4 and 5, a black wheel for transporting ultra-thin silicon wafers is provided. Grooves 2 are formed parallel to an end surface 41 of the black wheel 1 in a circumferential direction of the black wheel 1. The grooves 2 are uniformly distributed along an axial direction of the black wheel 1. Both side faces of each of the grooves 2 are symmetrically inclined with respect to a vertical direction, and a bottom surface of each of the grooves 2 have a curve shape in a sectional view, and the bottom surfaces of the grooves 2 are at a same distance from a side surface 42 of the black wheel 1. The compressed air lines 3 are in clearance fit with the grooves 2 and are provided in middles of the grooves 2. Each of the compressed air lines 3 is arranged obliquely with respect to a horizontal direction, and each of the air outlets 3.1 of the compressed air lines 3 is aligned with or face a side of the silicon wafer 4 close to the horizontal conveyor belt 6. Each of the grooves 2 has a depth larger than a diameter of each of the compressed air lines 3. In the present embodiment, the compressed air lines 3 include stainless steel.

A black wheel for transporting ultra-thin silicon wafers according to an embodiment of the present disclosure may achieve the following advantages effects:

By providing the grooves 2, an adsorption area between the black wheel 1 and the ultra-thin silicon wafer 4 may be reduced. By providing the compressed air lines 3, the adsorption of the silicon wafer 4 by the black wheel 1 may be further reduced, and a side of the silicon wafer 4 close to the horizontal conveyor belt 6 is blown up, to avoid from being tightly attached on the black wheel 1, thereby reducing a bending degree of the silicon wafer 4, avoiding damage to the silicon wafer 4, and facilitating the silicon wafer 4 to be transported to the next process, thereby improving the efficiency.

Some embodiments of the present disclosure have been described in detail above, but should not be considered as limiting the scope of the present disclosure. All equivalents and modifications made in accordance with the embodiments of the present disclosure shall still fall within the scope of the present disclosure.

What is claimed is:

1. A black wheel for transporting an ultra-thin silicon wafer to a next process device, comprising grooves provided on a side surface of the black wheel along a circumferential direction of the black wheel,
wherein compressed air lines are fixed onto a guard plate of the next process device and respectively accommodated within the grooves;
during a process of transporting the ultra-thin silicon wafer,
the black wheel is configured to keep rotating such that the ultra-thin silicon wafer is first absorbed onto the side surface of the black wheel and then transported towards the next process device;
the grooves are configured to avoid the compressed air lines such that the black wheel, the ultra-thin silicon wafer absorbed onto the side surface of the black wheel, and the compressed air lines are not interfered with each other; and
the compressed air lines are configured to blow an end of the ultra-thin silicon wafer absorbed onto the side surface of the black wheel away from the side surface when the end of the ultra-thin silicon wafer approaches the next process device, such that the end of the ultra-thin silicon wafer blown away from the side surface is transported onto the next process device.

2. The black wheel of claim 1, wherein the grooves are arranged parallel to an end surface of the black wheel.

3. The black wheel of claim 1, wherein the grooves are uniformly distributed on a side surface of the black wheel along an axial direction of the black wheel.

4. The black wheel of claim 1, wherein respective bottom surfaces of the grooves are at a same distance from a side surface of the black wheel, and the compressed air lines are provided at a same height from the side surface of black wheel.

5. The black wheel of claim 1, wherein the compressed air lines are in clearance fit with the grooves respectively.

6. The black wheel of claim 1, wherein each of the grooves has a depth larger than a diameter of each of the compressed air lines.

7. The black wheel of claim 1, wherein both side faces of each of the grooves are disposed vertically.

8. The black wheel of claim 1, wherein both side faces of each of the grooves are disposed symmetrically inclined with respect to a vertical direction.

9. The black wheel of claim 1, wherein when the ultra-thin silicon wafer is absorbed onto the side surface of the black wheel and approaches the next process device, an air outlet of each of the compressed air lines faces a side of the ultra-thin silicon wafer facing the black wheel and faces away from the next process device.

10. The black wheel of claim 1, wherein the black wheel is located between the ultra-thin silicon wafer to be transported and the next process device.

11. A black wheel for transporting an ultra-thin silicon wafer, wherein the black wheel is configured to convert the ultra-thin silicon wafer from a vertical state to a horizontal state and transport the ultra-thin silicon wafer onto a horizontal conveyor belt at a next process;
wherein the black wheel comprises grooves provided on a side surface of the black wheel along a circumferential direction of the black wheel;
compressed air lines are fixed onto a guard plate of the conveyor belt and respectively accommodated within the grooves;
during a process of transporting the ultra-thin silicon wafer,
the black wheel is configured to keep rotating such that the ultra-thin silicon wafer in the vertical state is first absorbed onto the side surface of the black wheel and then transported towards the conveyor belt;
the grooves are configured to avoid the compressed air lines such that the black wheel, the ultra-thin silicon wafer absorbed onto the side surface of the black wheel, and the compressed air lines are not interfered with each other; and
the compressed air lines are configured to blow an end of the ultra-thin silicon wafer absorbed onto the side surface of the black wheel away from the side surface when the end of the ultra-thin silicon wafer approaches the conveyor belt, such that the end of the ultra-thin silicon wafer blown away from the side surface is transported onto the conveyor belt.

12. The black wheel of claim 11, wherein the grooves are arranged parallel to an end surface of the black wheel.

13. The black wheel of claim 11, wherein the grooves are uniformly distributed on a side surface of the black wheel along an axial direction of the black wheel.

14. The black wheel of claim 11, wherein respective bottom surfaces of the grooves are at a same distance from a side surface of the black wheel.

15. The black wheel of claim 11, wherein the compressed air lines are in clearance fit with the grooves.

16. The black wheel of claim 11, wherein each of the grooves has a depth larger than a diameter of each of the compressed air lines.

17. The black wheel of claim 11, wherein both side faces of each of the grooves are disposed vertically.

18. The black wheel of claim 11, wherein both side faces of each of the grooves are disposed symmetrically inclined with respect to a vertical direction.

19. The black wheel of claim 11, wherein when the ultra-thin silicon wafer is absorbed onto the side surface of the black wheel and approaches the conveyor belt, an air outlet of each of the compressed air lines faces a side of the ultra-thin silicon wafer facing the black wheel and faces away from the conveyor belt.

20. The black wheel of claim 11, wherein the black wheel is located between the ultra-thin silicon wafer to be transported and the conveyor belt.

* * * * *